United States Patent
Song et al.

(10) Patent No.: US 12,127,367 B2
(45) Date of Patent: Oct. 22, 2024

(54) COMPOSITE COOLING SYSTEM AND DATA CENTER

(71) Applicant: Huawei Digital Power Technologies Co., Ltd., Shenzhen (CN)

(72) Inventors: Jinliang Song, Xi'an (CN); Wei Chen, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 182 days.

(21) Appl. No.: 17/821,649

(22) Filed: Aug. 23, 2022

(65) Prior Publication Data

US 2023/0060278 A1 Mar. 2, 2023

(30) Foreign Application Priority Data

Aug. 24, 2021 (CN) .......................... 202110973662.7

(51) Int. Cl.
*H05K 7/20* (2006.01)

(52) U.S. Cl.
CPC ..... *H05K 7/20145* (2013.01); *H05K 7/20172* (2013.01); *H05K 7/20209* (2013.01); *H05K 7/20309* (2013.01); *H05K 7/206* (2013.01); *H05K 7/207* (2013.01)

(58) Field of Classification Search
CPC ........... H05K 7/20145; H05K 7/20172; H05K 7/20209; H05K 7/20309; H05K 7/206; H05K 7/207
USPC ..................................................... 361/679.49
See application file for complete search history.

(56) References Cited

U.S. PATENT DOCUMENTS

| | | | |
|---|---|---|---|
| 5,718,628 A * | 2/1998 | Nakazato | ........... H05K 7/20745 236/49.5 |
| 6,557,357 B2 * | 5/2003 | Spinazzola | ............... G06F 1/20 62/89 |
| 6,772,604 B2 * | 8/2004 | Bash | .................. G05D 23/1931 62/186 |

(Continued)

FOREIGN PATENT DOCUMENTS

| | | |
|---|---|---|
| CN | 105937791 A | 9/2016 |
| CN | 205655422 U | 10/2016 |

(Continued)

OTHER PUBLICATIONS

Changzhi et al., "HVAC engineering design method and system analysis," ISBNs: 7-112-04623-8, Citation 129, 2001, 5 pages.

*Primary Examiner* — Anatoly Vortman
(74) *Attorney, Agent, or Firm* — Slater Matsil, LLP

(57) ABSTRACT

This application provides a composite cooling system. The composite cooling system includes an indoor air duct and an outdoor air duct that are independent of each other. The indoor air duct and the outdoor air duct intersect in a heat exchange area of the composite cooling system. A first-stage heat exchanger core, a second-stage heat exchanger core, and a first side air duct are disposed in the heat exchange area. The heat exchange area is constructed as a part of the outdoor air duct. The first-stage heat exchanger core, the first side air duct, and the second-stage heat exchanger core are sequentially arranged along a flow direction of the outdoor air duct. An inner cavity of the first-stage heat exchanger core and an inner cavity of the second-stage heat exchanger core each are further constructed as a part of the indoor air duct.

20 Claims, 7 Drawing Sheets

(56) References Cited

U.S. PATENT DOCUMENTS

| | | | |
|---|---|---|---|
| 6,775,137 B2 * | 8/2004 | Chu | H05K 7/20754 361/679.54 |
| 7,347,058 B2 * | 3/2008 | Malone | F24F 13/12 62/186 |
| 7,534,167 B2 * | 5/2009 | Day | H05K 7/20745 454/187 |
| 7,643,291 B2 * | 1/2010 | Mallia | F24F 11/76 165/104.33 |
| 7,903,407 B2 * | 3/2011 | Matsushima | H05K 7/20745 361/695 |
| 7,963,118 B2 * | 6/2011 | Porter | H05K 7/20827 62/449 |
| 8,248,799 B2 * | 8/2012 | Chang | G06F 1/20 361/691 |
| 11,330,737 B2 * | 5/2022 | Hui | H05K 7/20281 |
| 2004/0194490 A1 * | 10/2004 | Lee | F24F 3/1423 62/271 |
| 2010/0027216 A1 * | 2/2010 | Matsushima | H05K 7/20745 165/104.33 |
| 2013/0201618 A1 * | 8/2013 | Czamara | H05K 7/1497 361/679.48 |
| 2013/0213071 A1 * | 8/2013 | Takahashi | H05K 7/2079 165/185 |
| 2013/0269385 A1 * | 10/2013 | Takahashi | H05K 7/20745 165/104.14 |
| 2013/0283837 A1 * | 10/2013 | Takahashi | F24F 13/30 62/333 |
| 2016/0057892 A1 * | 2/2016 | Tabe | H05K 7/20745 361/679.46 |
| 2022/0225544 A1 * | 7/2022 | Xuan | H05K 7/20745 |
| 2022/0240423 A1 * | 7/2022 | Li | H05K 7/20836 |
| 2022/0400583 A1 * | 12/2022 | Song | F24H 15/35 |

FOREIGN PATENT DOCUMENTS

| | | |
|---|---|---|
| CN | 108507233 A | 9/2018 |
| CN | 111059674 A | 4/2020 |
| CN | 112954955 A | 6/2021 |
| EP | 4033869 A1 | 7/2022 |
| JP | 5520357 A | 2/1980 |

* cited by examiner

COMPOSITE COOLING SYSTEM AND DATA CENTER

CROSS-REFERENCE TO RELATED APPLICATIONS

This application claims priority to Chinese Patent Application No. 202110973662.7, filed on Aug. 24, 2021, which is hereby incorporated by reference in its entirety.

TECHNICAL FIELD

This application relates to the fresh air heat dissipation field, and in particular, to a composite cooling system and a data center equipped with the composite cooling system.

BACKGROUND

For an indoor scenario in which a heat source is disposed, especially a heat source is centrally disposed, heat dissipation usually needs to be performed on an area in which the heat source is located. A data center is used as an example. A plurality of servers are arranged in an equipment room of the data center, and these servers generate a large amount of heat when working. A cooling system of the data center is used for heat dissipation and cooling of the data center to ensure that the servers in the data center can normally work in an environment at a preset temperature.

A data center cooling system in the conventional technology is generally provided with a plurality of stages of heat exchanger cores. Outdoor air is guided to sequentially flow through the plurality of stages of heat exchanger cores, to implement heat exchange between the outdoor air and air inside the data center, to achieve heat dissipation on the air inside the data center. However, in a process in which the outdoor air flows through the plurality of stages of heat exchanger cores, a temperature of the outdoor air gradually increases. As a result, heat dissipation efficiency of a latter heat exchanger core in the plurality of stages of heat exchanger cores is low, and overall heat dissipation of the cooling system is affected.

SUMMARY

This application provides a composite cooling system and a data center equipped with the composite cooling system. In this application, the composite cooling system can improve heat dissipation efficiency of a multi-stage heat exchanger core, and specifically includes the following technical solutions.

According to a first aspect, this application provides a composite cooling system, including an indoor air duct and an outdoor air duct that are independent of each other. The indoor air duct and the outdoor air duct intersect in a heat exchange area of the composite cooling system. A first-stage heat exchanger core, a second-stage heat exchanger core, and a first side air duct are disposed in the heat exchange area. The heat exchange area is constructed as a part of the outdoor air duct. The first-stage heat exchanger core, the first side air duct, and the second-stage heat exchanger core are sequentially arranged along a flow direction of the outdoor air duct. An inner cavity of the first-stage heat exchanger core and an inner cavity of the second-stage heat exchanger core each are further constructed as a part of the indoor air duct. The first side air duct communicates between the heat exchange area and the outside of the composite cooling system. After passing through the first-stage heat exchanger core, air in the outdoor air duct is mixed with air in the first side air duct, and the mixes air then flows to the second-stage heat exchanger core.

In this application, the composite cooling system implements circulation of indoor air through the indoor air duct, and performs heat exchange on circulating air in the indoor air duct through an outdoor air duct. Specifically, the indoor air duct and the outdoor air duct that are independent of each other implement a heat exchange function in the heat exchange area, to perform heat dissipation on the indoor air. The overall heat exchange area is constructed as a part of the outdoor air duct, and the first-stage heat exchanger core, the first side air duct, and the second-stage heat exchanger core are sequentially disposed inside the heat exchange area along a flow direction of the outdoor air duct. An inner cavity of the first-stage heat exchanger core and an inner cavity of the second-stage heat exchanger core each are further constructed as a part of the indoor air duct.

Therefore, after entering the composite cooling system in this application through the outdoor air duct, external air can first flow through the first-stage heat exchanger core, and exchange heat with a part of indoor air in the inner cavity of the first-stage heat exchanger core, to reduce a temperature of the part of indoor air. Then, the external air flows into the first side air duct, and is mixed with external air that enters the heat exchange area from the first side air duct, thereby reducing a temperature of the external air that flows out of the first-stage heat exchanger core. When the mixed external air flows into the second-stage heat exchanger core again, because the temperature is lower, heat exchange may be performed between the mixed external air and another part of indoor air in the second-stage heat exchanger core, thereby achieving better heat dissipation. Therefore, in this application, all of the indoor air in the indoor air duct of the composite cooling system performs heat exchange with the external air with a lower temperature, ensuring overall heat dissipation of the indoor air, and improving an overall heat dissipation capability of the composite cooling system.

In a possible implementation, the outdoor air duct includes an air inlet and an air outlet that are opposite to each other, an air blower unit is further disposed on the outdoor air duct, and the air blower unit is configured to drive air outside the air inlet to flow into the outdoor air duct and flow out from the air outlet.

In this implementation, the air blower unit is used to drive flow of external air in the outdoor air duct, so that a flow rate of the external air in the outdoor air duct can be increased, thereby improving heat dissipation efficiency.

In a possible implementation, the composite cooling system includes a first humidification unit. The first humidification unit is located between the air inlet and the first-stage heat exchanger core, and is configured to increase humidity of air flowing into the outdoor air duct.

In this implementation, external air that enters the first-stage heat exchanger core for heat exchange is humidified, so that heat exchange efficiency of the external air in the first-stage heat exchanger core can be improved.

In a possible implementation, the composite cooling system further includes a second humidification unit, where the second humidification unit is located between the second-stage heat exchanger core and the first-stage heat exchanger core, and is configured to increase humidity of air flowing into the second-stage heat exchanger core.

In this implementation, external air that enters the second-stage heat exchanger core for heat exchange is humidified, so that heat exchange efficiency of the external air in the second-stage heat exchanger core can be improved.

In a possible implementation, the composite cooling system further includes a cooling unit. The cooling unit includes evaporators. The evaporators are located in the indoor air duct, and are located at a rear end of the first-stage heat exchanger core, a rear end of the first side air duct, and a rear end of the second-stage heat exchanger core along a flow direction of the indoor air duct.

In this implementation, the cooling unit is added to perform mechanical cooling on indoor air. The evaporators of the cooling unit are disposed at the rear ends of the first-stage heat exchanger core, the first side air duct, and the second-stage heat exchanger core, to perform mechanical cooling on indoor air that is pre-cooled by external air, to improve efficiency of cooling on the indoor air.

In a possible implementation, stop valves are separately disposed in an inner cavity of the first-stage heat exchanger core and an inner cavity of the second-stage heat exchanger core. The stop valve is configured to control a flow path of the indoor air duct.

In this implementation, corresponding to a scenario in which a temperature of indoor air is low and a heat exchange requirement of indoor air is low, the composite cooling system in this application may adjust, by using the stop valve to control the flow path of the indoor air duct, flow volume of indoor air that heat exchange is to be performed on, to avoid unnecessary energy consumption.

In a possible implementation, the indoor air duct includes an air inlet section and an air return section, in a flow direction of the indoor air duct, the air inlet section is located at a front end of the heat exchange area, the air return section is located at a rear end of the heat exchange area, the first side air duct further communicates with the air inlet section and the air return section, a first air valve is disposed between the first side air duct and the air inlet section, a second air valve is disposed between the first side air duct and the air return section, and the first side air duct is also constructed as a part of the indoor air duct.

In this implementation, when the first side air duct is also constructed as a part of the indoor air duct, the first-stage heat exchanger core and the second-stage heat exchanger core may be closed by using the stop valve, so that indoor air flows into the air return section from the air inlet section only through the first side air duct. In this case, the composite cooling system in this application may work in a fresh air mode. External air may flow in from the first side air duct, mix with indoor air in the first side air duct, and then flow into the air return section, to implement partial exchange of the indoor air.

In a possible implementation, the first side air duct further includes a filtering component. The filtering component is located at an end that is of the first side air duct and that is away from the heat exchange area, and the filtering component is configured to filter air that enters the heat exchange area from the first side air duct.

In this implementation, the filtering component filters external air flowing into the first side air duct, to ensure that indoor air in the fresh air mode is clean, and prevent external impurities from flowing into the room.

In a possible implementation, the first side air duct further includes a separator. The separator is disposed perpendicular to a flow direction of the indoor air duct. The separator divides the side air duct into a first air outlet area and a first air inlet area. The first air outlet area is connected to the first air valve, and the first air inlet area is connected to the second air valve.

In this implementation, the separator is used to block the first side air duct, so that indoor air flowing out of the air inlet section flows out through the first air outlet area, and external air flows into the air return section through the first air inlet area, to completely replace the indoor air.

In a possible implementation, the separator is a movable separator. A gap between the first air inlet area and the first air outlet area may be adjusted by controlling movement of the separator in the first side air duct, so that a part of indoor air in the first air inlet area flows into the first air outlet area.

In a possible implementation, the composite cooling system further includes a second side air duct, the second side air duct is located between the air inlet and the first-stage heat exchanger core, the second side air duct communicates with the air inlet section and the air return section, a third air valve is disposed between the second side air duct and the air inlet section, a fourth air valve is disposed between the second side air duct and the air return section, and the second side air duct is also constructed as a part of the indoor air duct.

In this implementation, introduction of the second side air duct may supplement the first side air duct, and the first side air duct and the second side air duct work together to further control exchange volume of indoor air in the composite cooling system in the fresh air mode, thereby more accurately adjusting a temperature of the indoor air.

In a possible implementation, the second side air duct further includes a filtering component. The filtering component is located at an end that is of the second side air duct and that is away from the heat exchange area, and the filtering component is configured to filter air that enters the heat exchange area from the second side air duct.

In a possible implementation, the second side air duct further includes a separator. The separator is disposed perpendicular to a flow direction of the indoor air duct. The separator divides the side air duct into a second air outlet area and a second air inlet area. The second air outlet area is connected to the third air valve, and the second air inlet area is connected to the fourth air valve.

In a possible implementation, a gap between the second air inlet area and the second air outlet area may be adjusted by controlling movement of the separator in the second side air duct, so that a part of indoor air in the second air inlet area flows into the second air outlet area.

According to a second aspect, this application provides a data center, including an equipment room and the composite cooling system provided in the first aspect of this application, where two opposite ends of an indoor air duct separately communicate with an indoor area of the equipment room.

In the second aspect of this application, because the equipment room of the data center uses the composite cooling system in the first aspect to perform heat dissipation, the data center in this application can also improve heat dissipation efficiency, and implement a fresh air mode based on the foregoing implementations, and perform more precise air flow control for the fresh air mode.

DETAILED DESCRIPTION OF ILLUSTRATIVE EMBODIMENTS

The following describes technical solutions in embodiments of this application with reference to accompanying drawings in embodiments of this application. It is clear that the described embodiments are merely some but not all of embodiments of this application. All other embodiments obtained by a person of ordinary skill in the art based on embodiments of this application without creative efforts shall fall within the protection scope of this application.

A composite cooling system of this application may be used in an indoor environment with a heat source, and is particularly applicable to an indoor environment in which a heat source is centrally arranged, for example, may be used in a data center. The following uses the data center as an example for description.

Figure 1:
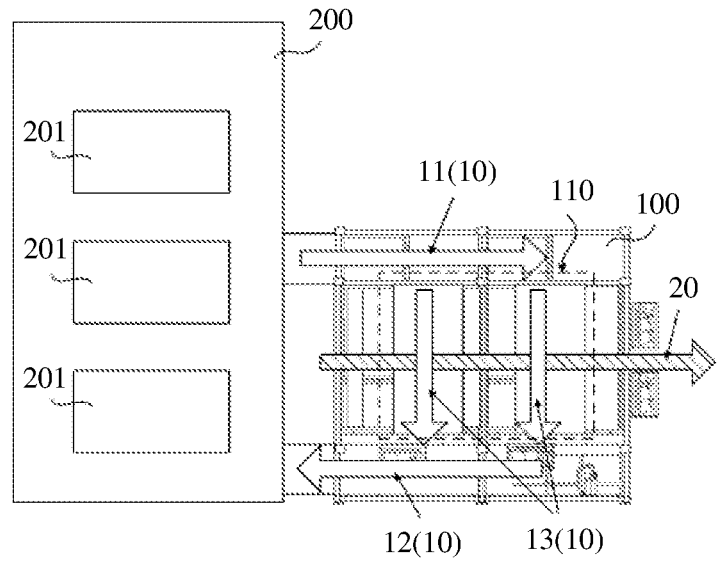
FIG. 1 is a schematic diagram of an application scenario of a composite cooling system in a data center according to this application.

FIG. 1 is a schematic diagram of a scenario in which a composite cooling system 100 is used in a data center according to this application.

The data center includes an equipment room 200, and at least one IT device (for example, a server 201) and/or a power supply apparatus are disposed in the equipment room 200. The at least one IT device and/or the power supply apparatus generate a large amount of heat when working. In this application, the composite cooling system 100 is configured to implement cooling and heat dissipation of the data center. In embodiments of this application, the data center may be a micro-modular data center, a prefabricated data center, or a floor or a room that is used to place an IT server in a building. For the foregoing data centers of different forms, the composite cooling system 100 may be disposed inside the equipment room 200 of the data center, or may be disposed outside the equipment room 200, or may be partially located inside the equipment room 200 and partially located outside the equipment room 200.

In some implementation scenarios, the data center includes a temperature control system and another auxiliary device in addition to the IT device and the power supply apparatus. Therefore, the composite cooling system 100 in this embodiment of this application may also be considered as a part of the data center.

In this application, the composite cooling system 100 includes an indoor air duct 10 and an outdoor air duct 20. The indoor air duct 10 communicates with the inside of the equipment room 200. The indoor air duct 10 includes an air inlet section 11, an air return section 12, and a heat exchange section 13. The air inlet section 11 and the air return section 12 separately communicate with the equipment room 200 of the data center. Ends away from the equipment room 200 that are of the air inlet section 11 and the air return section 12 separately communicate with the heat exchange section 13. In other words, the indoor air duct 10 includes the air inlet section 11 that communicates with the heat exchange section 13, the heat exchange section 13 that communicates with the air return section 12, and the air return section 12. The heat exchange section 13 is located between the air inlet section 11 and the air return section 12, and the air inlet section 11 and the air return section 12 separately communicate with the equipment room 200.

The air inlet section 11 is configured to draw indoor air in the equipment room 200 of the data center into the indoor air duct 10 and transmit the indoor air to the heat exchange section 13. The heat exchange section 13 is configured to perform heat dissipation and cooling on the indoor air sent by the air inlet section 11. The air return section 12 is configured to send the cooled air to the equipment room 200 of the data center, to implement air circulation and cooling of the equipment room 200 of the data center. In some embodiments, the heat exchange section 13 is further configured to implement a function of exchanging a part of or all of indoor air with fresh air. The part of or all of fresh air for exchange may be sent back to the equipment room 200 through the air return section 12, and the function of exchanging a part of or all of air in the equipment room 200 is implemented while cooling is implemented.

Therefore, the equipment room 200 of the data center and the indoor air duct 10 form circulating air path containment. The composite cooling system 100 may take heat, generated when the server 201 works, out of the equipment room via air flowing out of the air return section 12. After cooling and heat dissipation by using the composite cooling system 100 in this application, this part of air is sent back to the equipment room 200 from the air inlet section 11. This implements overall heat dissipation on the equipment room 200 of the data center. In the embodiment shown in FIG. 1, the air inlet section 11 is located below the air return section 12. Cool air sent in by the air return section 12 flows upward in the equipment room, to balance a temperature of air in the equipment room.

The outdoor air duct 20 and the indoor air duct 10 are independent of each other and are contained. The outdoor air duct 20 runs through the composite cooling system 100, and two opposite ends of the outdoor air duct 20 separately communicate with the outside of the composite cooling system 100. The outdoor air duct 20 is configured to guide external air outside the composite cooling system 100 to the outdoor air duct 20 from one end. The external air flows through the composite cooling system 100 and then flows out from the other end of the outdoor air duct 20. The heat exchange area 110 is further disposed inside the composite cooling system 100. The heat exchange section 13 of the indoor air duct 10 is disposed in the heat exchange area 110, and the outdoor air duct 20 passes through the heat exchange area 110. In other words, in the composite cooling system 100 in this application, the indoor air duct 10 and the outdoor air duct 20 intersect in the heat exchange area 110. It can be understood that, when the external air flowing in the outdoor air duct 20 passes through the heat exchange section 13, heat exchange can be performed between the external air flowing in the outdoor air duct 20 and indoor air flowing in the heat exchange section 13, to achieve heat exchange and cooling on the indoor air.

Figure 2:
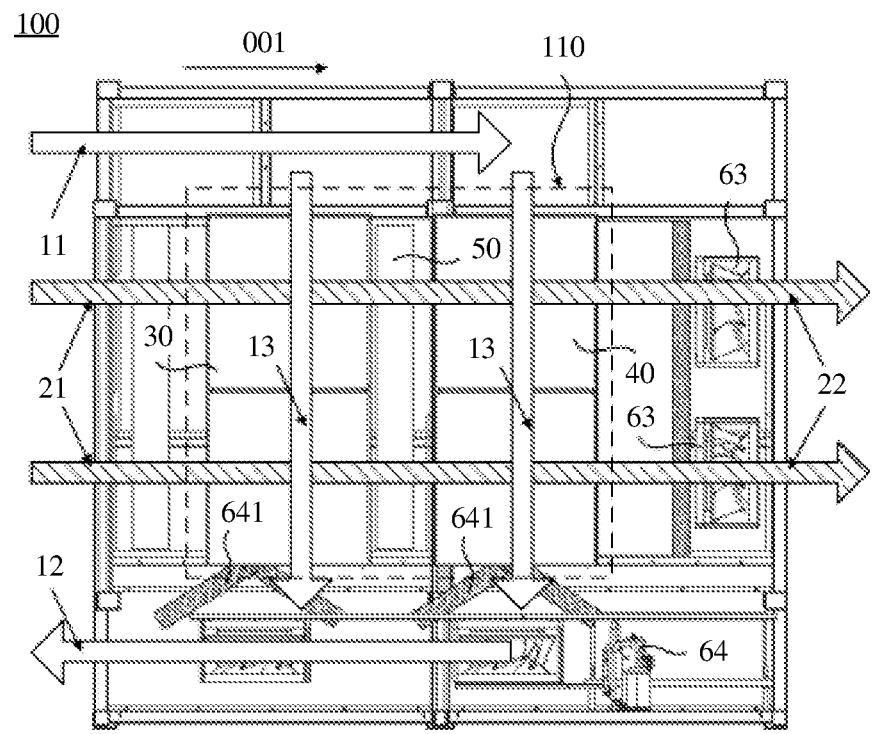
FIG. 2 is a schematic diagram of an internal structure of a composite cooling system according to this application.

On the other hand, because the outdoor air duct 20 passes through the heat exchange area 110, the heat exchange area 110 may also be considered as a part of the outdoor air duct 20. Refer to FIG. 2. In the composite cooling system 100 of this application, a first-stage heat exchanger core 30, a second-stage heat exchanger core 40, and a first side air duct 50 are further disposed in the heat exchange area 110. An air flow direction along the outdoor air duct 20 is defined as a first direction 001. In this case, the first-stage heat exchanger core 30, the first side air duct 50, and the second-stage heat exchanger core 40 are sequentially arranged along the first direction 001. The first side air duct 50 is located between the first-stage heat exchanger core 30 and the second-stage heat exchanger core 40. In other words, when passing through the heat exchange area 110, the external air flowing in the outdoor air duct 20 first flows through the first-stage heat exchanger core 30, then flows through the first side air duct 50, and finally flows through the second-stage heat exchanger core 40.

The first-stage heat exchanger core 30 and the second-stage heat exchanger core 40 each have an inner cavity, and both the inner cavity of the first-stage heat exchanger core 30 and the inner cavity of the second-stage heat exchanger core 40 are constructed as the heat exchange section 13 of the indoor air duct 10. In other words, the inner cavity of the first-stage heat exchanger core 30 separately communicates with the air inlet section 11 and the air return section 12 of the indoor air duct 10. The indoor air in the air inlet section 11 of the indoor air duct 10 may flow to the air return section 12 through the inner cavity of the first-stage heat exchanger core 30. When flowing through the first-stage heat exchanger core 30, this part of indoor air may perform heat exchange with the external air in the outdoor air duct 20, to achieve heat exchange. It should be noted that the external air flowing in the outdoor air duct 20 may flow through an outer surface of the first-stage heat exchanger core 30, to implement heat exchange with indoor air in an inner cavity of the first-stage heat exchanger core 30. In some other embodiments, the inner cavity of the first-stage heat exchanger core 30 may be further disposed as a hollow-out inner cavity. Indoor air flows in the inner cavity, and further the first-stage heat exchanger core 30 allows the external air in the outdoor air duct 20 to pass through the hollow-out area inside the first-stage heat exchanger core 30 along the first direction 001, to increase a contact area between the external air and the first-stage heat exchanger core 30, and achieve better heat exchange.

An inner cavity of the second-stage heat exchanger core 40 also separately communicates with the air inlet section 11 and the air return section 12 of the indoor air duct 10. The other part of indoor air in the air inlet section 11 of the indoor air duct 10 may flow to the air return section 12 through the inner cavity of the second-stage heat exchanger core 40. When flowing through the second-stage heat exchanger core 40, the other part of indoor air may also perform heat exchange with the external air in the outdoor air duct 20. Therefore, two parts of indoor air in the indoor air duct 10 can separately implement heat dissipation and cooling when one part of indoor air flows through the inner cavity of the first-stage heat exchanger core 30 and the other part of air flows through the second-stage heat exchanger core 40. It may be understood that the inner cavity of the second-stage heat exchanger core 40 may also be a hollow-out inner cavity, and a structure and a function of the inner cavity are similar to those in the foregoing embodiment in which the first-stage heat exchanger core 30 has a hollow-out inner cavity. To satisfy a heat dissipation requirement of the equipment room 200 of the data center, a two-stage or multi-stage heat exchanger core structure is disposed. This can further increase flow volume of indoor air in the indoor air duct 10 and improve an overall heat dissipation capability of the composite cooling system 100.

Figure 3:
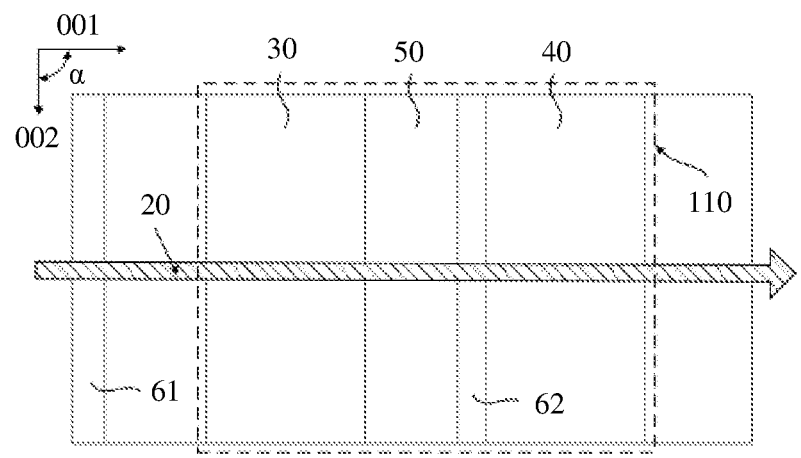
FIG. 3 is a schematic diagram of a planar structure of a composite cooling system according to this application.

FIG. 3 is a schematic diagram of a planar structure of a composite cooling system 100 according to this application.

The first side air duct 50 extends along a second direction 002. The second direction 002 and the first direction ow form an included angle α. In the embodiment shown in the figure, the included angle α is set to 90 degrees. In some other embodiments, the included angle α may alternatively be set to another value. The first side air duct 50 communicates with the outside of the composite cooling system 100 along the second direction 002, so that external air that is along the second direction 002 and that is of the composite cooling system 100 can also flow into the heat exchange area 110 through the first side air duct 50. In the embodiment shown in the figure, two opposite ends of the first side air duct 50 separately extend along the second direction 002, and the two opposite ends separately communicate with the outside of the composite cooling system 100 on a side on which the end is located. In this case, external air from two opposite sides of the composite cooling system 100 may flow into the heat exchange area 110 through the first side air duct 50.

Figure 4:
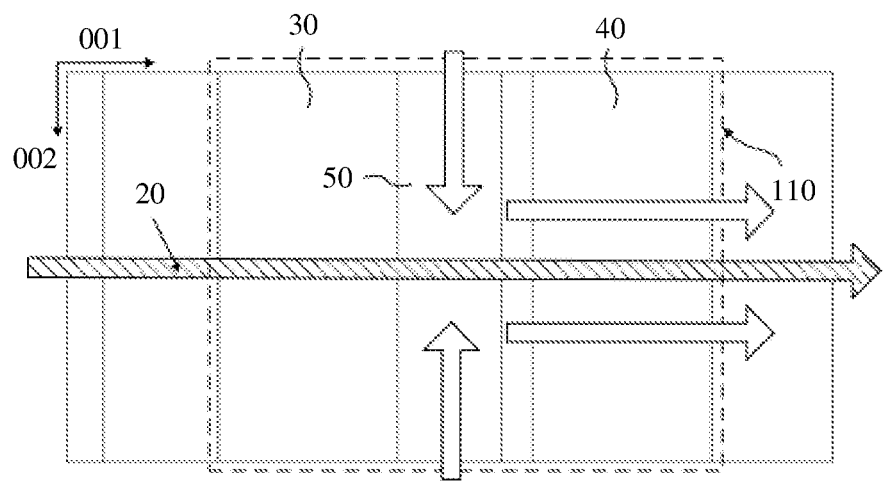
FIG. 4 is a schematic diagram of an air path of an outdoor air duct in a composite cooling system according to this application.

As mentioned above, the heat exchange area 110 is constructed as a part of the outdoor air duct 20, and the first side air duct 50 is located at a front end of the second-stage heat exchanger core 40 in a flow direction of external air in the outdoor air duct 20. Therefore, along an air path of the outdoor air duct 20 in the composite cooling system 100 shown in FIG. 4, external air flowing into the heat exchange area 110 from the first side air duct 50 may be mixed with external air flowing through the first-stage heat exchanger core 30, and the mixed air flows into the second-stage heat exchanger core 40 from the first side air duct 50.

Figure 5:
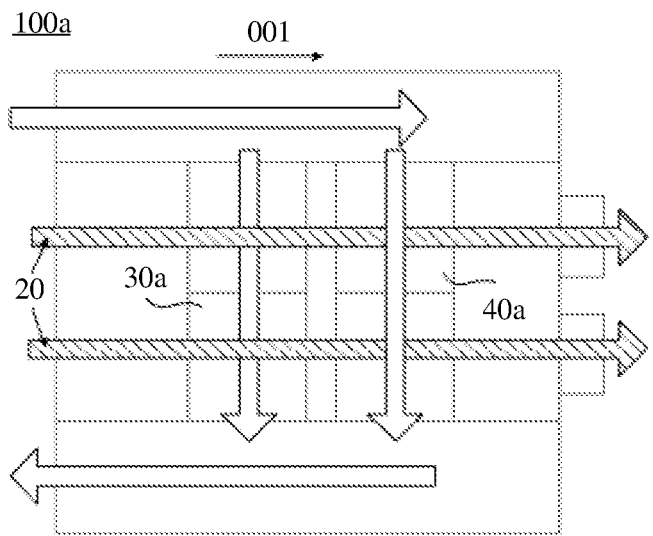
FIG. 5 is a schematic diagram of an internal structure of a composite cooling system in the conventional technology.

FIG. 5 is a simplified diagram of an internal structure of an existing composite cooling system 100a. In FIG. 5, the composite cooling system 100a also includes an indoor air duct 10a and an outdoor air duct 20a. The indoor air duct 10a and the outdoor air duct 20a intersect at a heat exchange area 100a of the composite cooling system 100a. A first-stage heat exchanger core 30a and a second-stage heat exchanger core 40a are also disposed in the heat exchange area 110a. Indoor air in the indoor air duct 10a separately flows through inner cavities of the first-stage heat exchanger core 30a and the second-stage heat exchanger core 40a, and performs heat exchange with external air in the outdoor air duct 20a. Specifically, the external air in the indoor air duct 10a first flows through the first-stage heat exchanger core 30a, and then directly flows through the second-stage heat exchanger core 40a, so that heat dissipation and cooling are sequentially performed on the indoor air flowing in the two heat exchanger cores.

In the existing composite cooling system 100a shown in FIG. 5, when the external air in the outdoor air duct 20a flows through the first-stage heat exchanger core 30a, a temperature difference between the external air and the indoor air in the first-stage heat exchanger core 30a is large, to achieve good heat exchange. After this part of external air flows out of the first-stage heat exchanger core 30*a*, a temperature of this part of external air that has undergone heat exchange has risen. Subsequently, when the external air whose temperature rises flows into the second-stage heat exchanger core 40*a*, a temperature difference between the external air and the indoor air in the second-stage heat exchanger core 40*a* is reduced. Consequently, heat dissipation of the indoor air in the second-stage heat exchanger core 40*a* is reduced, and overall heat dissipation of the existing composite cooling system 100*a* is poor.

However, in this application, the composite cooling system 100 guides external air outside the composite cooling system 100 by using a structure of the first side air duct 50, so that the air guided through the first side air duct 50 is mixed with the external air flowing through the first-stage heat exchanger core 30. This reduces a temperature of external air that enters the second-stage heat exchanger core 40, and increases a temperature difference between the external air and indoor air in the second-stage heat exchanger core 40, to ensure heat exchange efficiency of the external air in the second-stage heat exchanger core 40, and improve heat dissipation of the second-stage heat exchanger core 40. Therefore, compared with the existing composite cooling system 110*a*, the composite cooling system 100 in this application has higher overall heat dissipation and cooling efficiency, can better cool the equipment room 200 of the data center, and ensure stable running of the data center.

It may be understood that, to satisfy a heat dissipation requirement of the equipment room 200 of the data center, the composite cooling system 100 in this application may further be provided with a multi-stage heat exchanger core structure that includes more than two stages of heat exchanger cores, to increase flow volume of indoor air in the indoor air duct 10 and improve an overall heat dissipation capability of the composite cooling system 100. For the composite cooling system 100 having the multi-stage heat exchanger core structure, the first side air duct 50 may be further disposed between any two adjacent stages of heat exchanger cores, to implement mixed cooling on external air in a heat exchange process, so that the overall heat dissipation capability of the composite cooling system 100 is improved.

According to test, compared with a heat dissipation capability of the existing composite cooling system 100*a*, when a proportion of external air that enters the composite cooling system 100 from the first side air duct 50 in this application accounts for 20% of overall external air flowing through the second-stage heat exchanger core 40, cooling of the composite cooling system 100 on the indoor air is improved by more than 6%. An increase in volume of external air that enters the first side air duct 50 can further improve heat dissipation of the composite cooling system 100.

As shown in FIG. 2 and FIG. 3, the outdoor air duct 20 includes an air inlet 21 and an air outlet 22 opposite to each other along the first direction 001. External air enters the outdoor air duct 20 from the air inlet 21, and flows out of the composite cooling system 100 from the air outlet 22. In an embodiment, the composite cooling system is further provided with an air blower unit 63. The air blower unit 63 is disposed on the outdoor air duct 20, and is configured to drive external air to flow in the outdoor air duct 20, to improve flow rates of internal air and external air of the outdoor air duct 20 and ensure heat exchange efficiency. The air blower unit 63 is disposed on the outdoor air duct 20, and may be disposed at the air inlet 21, or may be disposed between the air inlet 21 and the air outlet 22.

In the schematic diagram shown in the figure, air blower units 63 are disposed at the rear end of the air outlet 22 along the first direction 001. Therefore, when driving external air to enter the outdoor air duct 20 from the air inlet 21, the air blower unit 63 also drives the external air to enter the heat exchange area 110 from the first side air duct 50. It may be understood that, when more external air enters the heat exchange area 110 from the first side air duct 50, this part of external air is mixed with external air flowing through the first-stage heat exchanger core 30, and therefore a temperature of mixed external air is lower. As a result, heat dissipation and cooling of the second-stage heat exchanger core 40 are better, and an overall heat dissipation capability of the composite cooling system 100 can be improved.

In an embodiment, the composite cooling system 100 further includes a first humidification unit 61. The first humidification unit 61 is disposed between the air inlet 21 of the outdoor air duct 20 and the first-stage heat exchanger core 30, and is configured to humidify external air that enters from the air inlet 21, to improve heat exchange efficiency of external air in the first-stage heat exchanger core 30. It may be understood that, when humidity in external air is higher, more heat can be taken away from the first-stage heat exchanger core 30 in a heat exchange process of the external air, to achieve better heat dissipation on indoor air in the first-stage heat exchanger core 30. In the schematic diagram shown in the figure, the first humidification unit 61 is implemented by using a wet film.

In an embodiment, the composite cooling system 100 may further include a second humidification unit 62. The second humidification unit 62 is disposed between the first-stage heat exchanger core 30 and the second-stage heat exchanger core 40. The second humidification unit 62 is configured to humidify external air flowing into the second-stage heat exchanger core 40, to improve heat exchange efficiency of the external air in the second-stage heat exchanger core 40. Effect of the second humidification unit 62 is similar to that of the first humidification unit 61, and the second humidification unit 62 may also be implemented by using a wet film. Further, in the schematic diagram shown in the figure, the second humidification unit 62 may alternatively be disposed between the first side air duct 50 and the second-stage heat exchanger core 40. In this case, the second humidification unit 62 not only humidifies external air flowing through the first-stage heat exchanger core 30, but also humidifies external air flowing into the heat exchange area 110 from the first side air duct 50, so that humidity of external air flowing into the second-stage heat exchanger core 40 is increased at the second humidification unit 62. In this way, heat exchange in the second-stage heat exchanger core 40 is better.

It should be noted that the first humidification unit 61 and the second humidification unit 62 may be electrically connected to a controller (not shown in the figure) of the composite cooling system 100, and the controller controls power of the first humidification unit 61 and the second humidification unit 62, to control respective humidification volume of external air of the first humidification unit 61 and the second humidification unit 62. It may be understood that, in some scenarios, when a temperature of indoor air at the air inlet section 11 is low, the controller may also control the first humidification unit 61 and the second humidification unit 62 to stop working, and a preset heat dissipation requirement can be satisfied without humidification on external air. In some other scenarios, power of the first humidification unit 61 and power of the second humidification unit 62 may be differently configured, to control overall heat dissipation of external air on indoor air.

In an embodiment, the composite cooling system 100 further includes a cooling unit 64. The cooling unit 64 is a mechanical cooling system, and includes evaporators 641. The evaporators 641 are located in the indoor air duct 10, and the evaporators 641 are disposed, along an air flow direction of the indoor air duct 10, at a rear end of the first-stage heat exchanger core 30, a rear end of the first side air duct 50, and a rear end of the second-stage heat exchanger core 40. In other words, the evaporators 641 are disposed in the air return section 12 of the indoor air duct 10. The evaporator 641 may perform mechanical cooling on indoor air flowing through the evaporator 641, to reduce a temperature of the indoor air through evaporation and heat absorption.

The cooling unit 64 may also be electrically connected to the controller of the composite cooling system 100, and power of the cooling unit is controlled by the controller. Specifically, the controller of the composite cooling system 100 may further be electrically connected to a temperature sensor in the equipment room 200, or the controller may be electrically connected to an IT device in the equipment room 200, and control cooling efficiency of the cooling unit 64 based on a real-time temperature in the equipment room 200 or based on a workload of the IT device in the equipment room, to more accurately control an indoor temperature of the equipment room 200.

On the other hand, the evaporators 641 are disposed in the air return section 12. Before being cooled by the evaporator 641, indoor air that enters the air return section 12 has completed heat exchange with external air in the outdoor air duct 20. In this case, a temperature of the indoor air that enters the air return section 12 is lower. The cooling unit 64 cools the indoor air with the lower temperature, so that cooling volume of the indoor air is controlled. This helps reduce overall energy consumption of the composite cooling system 100.

Figure 6:
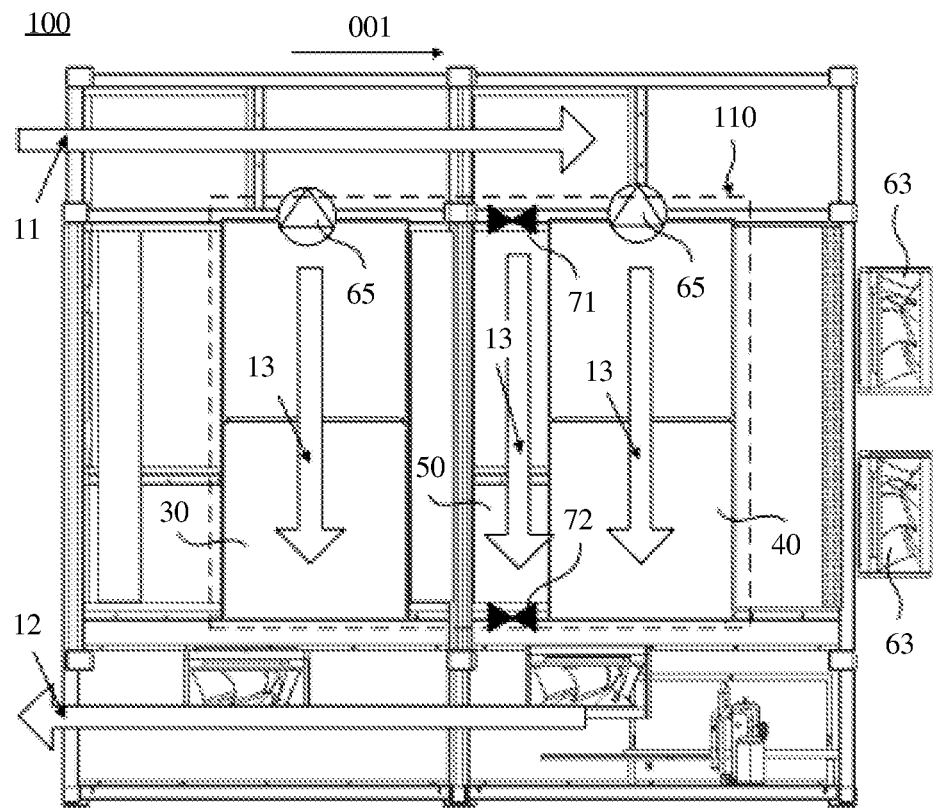
FIG. 6 is a schematic diagram of an internal structure of another composite cooling system according to this application.

Refer to the embodiment in FIG. 6. The composite cooling system 100 is further provided with stop valves 65. The stop valves 65 are separately disposed at the first-stage heat exchanger core 30 and the second-stage heat exchanger core 40. The stop valve 65 is configured to control flow volume of indoor air in an inner cavity of a heat exchanger core corresponding to the stop valve 65. Specifically, the stop valves 65 may be electrically connected to the controller of the composite cooling system 100. The controller may separately control the stop valves 65, to separately control flow volume of indoor air in the first-stage heat exchanger core 30 and the second-stage heat exchanger core 40. As mentioned above, there is a difference between heat exchange efficiency of the first-stage heat exchanger core 30 and heat exchange efficiency of the second-stage heat exchanger core 40. When overall flow volume of indoor air is small, the composite cooling system 100 in this application may control flow volume of indoor air in the first-stage heat exchanger core 30 to be greater than flow volume of indoor air in the second-stage heat exchanger core 40, to further ensure that more indoor air flows through the first-stage heat exchanger core 30 that has better heat exchange, thereby ensuring overall heat exchange efficiency of the composite cooling system 100.

In an embodiment, the first side air duct 50 further separately communicates with the air inlet section 11 and the air return section 12. The first side air duct 50 further communicates with the inner cavity of the first-stage heat exchanger core 30 and the inner cavity of the second-stage heat exchanger core 40 in parallel. The first side air duct 50 is further constructed as a part of the heat exchange section 13 of the indoor air duct 10. Therefore, indoor air in the air inlet section 11 may further flow through the first side air duct 50 to the air return section 12. Further, a first air valve 71 may be disposed between the first side air duct 50 and the air inlet section 11, and a second air valve 72 may be disposed between the first side air duct 50 and the air return section 12. The first air valve 71 and the second air valve 72 are also separately connected to the controller of the composite cooling system 100. The controller may control flow volume of indoor air in the first side air duct 50 by controlling the first air valve 71 and the second air valve 72. When simultaneously controlling the first air valve 71, the second air valve 72, the stop valve 65 disposed at the first-stage heat exchanger core 30, and the stop valve 65 disposed at the second-stage heat exchanger core 40, the controller can further control overall flow volume of indoor air in the indoor air duct 10, and allocate flow volume of indoor air flowing through the heat exchange area 110 at the same time.

Figure 7:
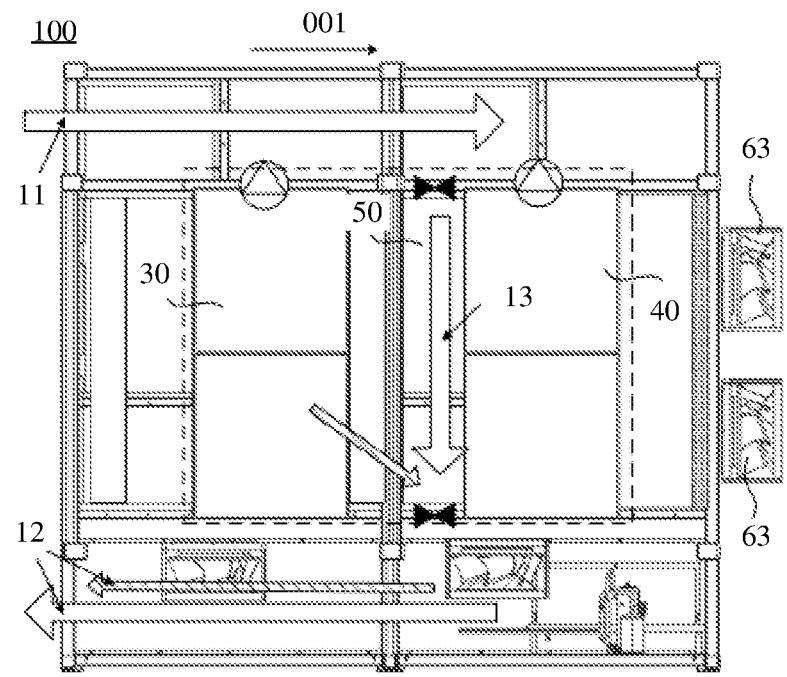
FIG. 7 is a schematic diagram of an air path of an indoor air duct in another composite cooling system according to this application.

Refer to a schematic diagram of an air path of the indoor air duct 10 in the composite cooling system 100 shown in FIG. 7. Because two ends of the first side air duct 50 further communicate with the outside of the composite cooling system 100, when indoor air flows through the first side air duct 50, a part of external air also flows into the air return section 12 through the first side air duct 50. Because overall flow volume of indoor air is maintained, a part of indoor air flowing into the first side air duct 50 from the air inlet section 11 flows out of the composite cooling system 100 from the first side air duct 50. Therefore, when the first side air duct 50 is constructed as a part of the heat exchange section 13, the composite cooling system 100 in this application may further work in a partial fresh air mode. In other words, when the indoor air is controlled to flow through the first side air duct 50, a characteristic that the first side air duct 50 communicates with the outside is used, so that a part of external air is exchanged with a part of indoor air flowing into the first side air duct 50. External air obtained through exchanging is mixed with remaining indoor air, and flows back to the equipment room 200 of the data center through the air return section 12. In this case, a part of indoor air that flows back through the air return section 12 is external fresh air outside the composite cooling system 100. Therefore, air in the equipment room 200 of the data center is exchanged.

In a process of describing the foregoing embodiments, the composite cooling system 100 is mostly in a heat dissipation and cooling working mode. However, or the equipment room 200 of the data center, there may further be a ventilation requirement in a running process of the equipment room 200. Therefore, the composite cooling system 100 in the embodiments shown in FIG. 6 and FIG. 7 of this application may further work in a fresh air mode or partial fresh air mode, to satisfy a working requirement of the equipment room 200 of the data center.

Figure 8:
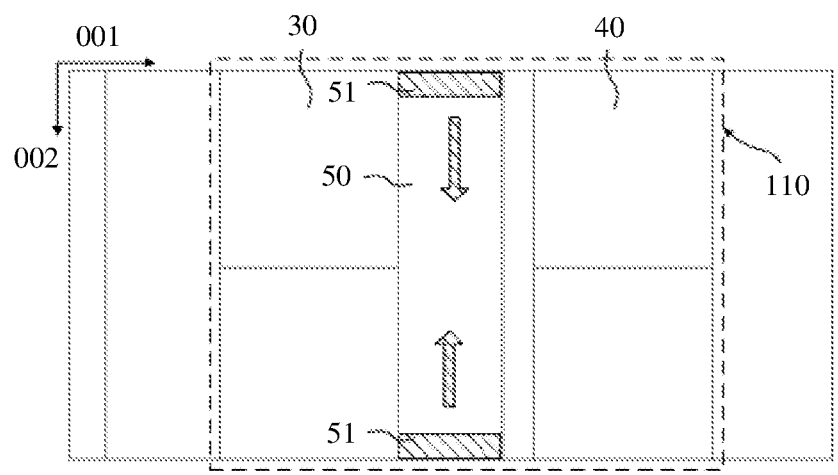
FIG. 8 is a schematic diagram of a planar structure of another composite cooling system according to this application.

Refer to FIG. 8. Filtering components 51 are further disposed on the first side air duct 50. The filtering components 51 are located at ends that are of the first side air duct 50 and that are away from the heat exchange area 110, and are configured to filter external air. In the fresh air mode, newly supplemented external air enters the indoor air duct 10 from the first side air duct 50. Therefore, if cleanliness of the external air is not high, indoor air is easily polluted, and air quality in the equipment room 200 of the data center is affected. Therefore, in order to ensure cleanliness of indoor air in the indoor air duct 10, the filtering component 51 is disposed in the first side air duct 50, to bring about cleanliness of filtering on the external air supplemented into the indoor air duct 10, so that the external air does not pollute the indoor air flowing in the indoor air duct 10.

In an embodiment, stop valves 65 may also be disposed at two opposite ends of the outdoor air duct 20, namely, the air inlet 21 and the air outlet 22. The controller of the composite cooling system 100 controls the two stop valves 65 to control flow volume of air in the outdoor air duct 20. The outdoor air duct 20 also communicates with the heat exchange area 110, and the first side air duct 50 is located in the heat exchange area 110. Therefore, when the composite cooling system 100 in this application works in a fresh air mode, external air in the outdoor air duct 20 may also enter the air return section 12 through the first side air duct 50, and becomes a part of indoor air flowing back to the equipment room 200. In other words, in some embodiments, a part of fresh air of mixed fresh air indoor air in the first side air duct 50 further comes from the outdoor air duct 20.

Generally, the outdoor air duct 20 is configured to bring in large volume of external air when the composite cooling system 100 is in a heat dissipation and cooling mode, to complete heat exchange of indoor air. Therefore, if the filtering component 51 is disposed at the outdoor air duct 20, volume of air that needs to be filtered by the filtering component 51 is too large, and it is difficult to control air cleanliness after filtering. Therefore, in this embodiment, the stop valves 65 are separately disposed at the air inlet 21 and the air outlet 22. When the composite cooling system 100 in this application is in the fresh air mode, the controller closes the two stop valves 65 to block communication between the outdoor air duct 20 and external air. In this case, external air flows into the indoor air duct 10 only through the first side air duct 50. Only filtering of the filtering component 51 at the first side air duct 50 needs to be controlled, so that quality of indoor air in the indoor air duct 10 can be ensured, and overall cleanliness of air in the equipment room 200 can be ensured.

Figure 9:
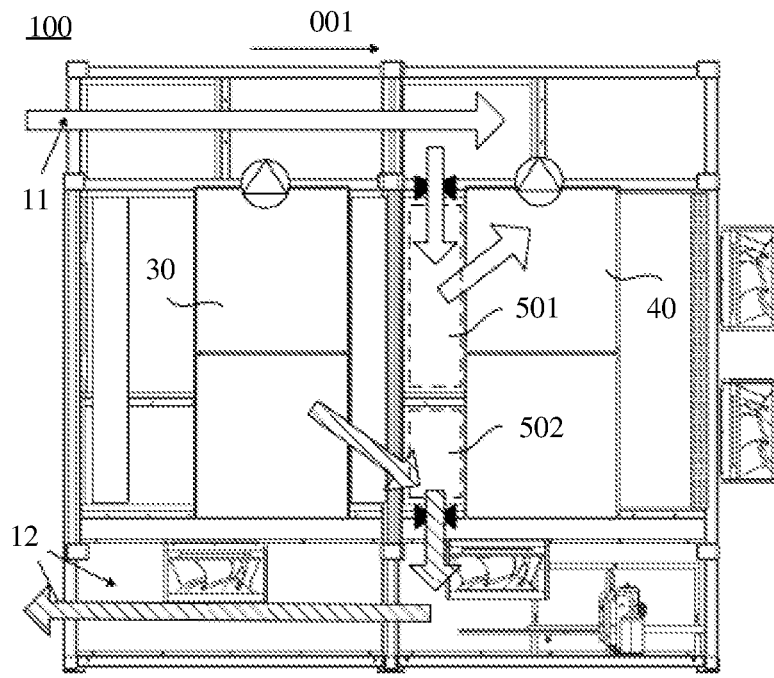
FIG. 9 is a schematic diagram of an internal structure of another composite cooling system according to this application.

As shown in FIG. 9, in an embodiment, a separator 53 is further disposed inside the first side air duct 50. The separator 53 is disposed perpendicular to a flow path of the indoor air duct 10, and divides the first side air duct 50 into a first air outlet area 501 and a first air inlet area 502. In FIG. 9, the flow path of the indoor air duct 10 at the first side air duct 50 is from top to bottom. Therefore, the separator 53 is disposed in a horizontal direction, and the first side air duct 50 is divided into a first air outlet area 501 and a first air inlet area 502 that are opposite to each other. It may be understood that the first air outlet area 501 communicates with the air inlet section 11 of the indoor air duct 10, and the first air inlet area 502 communicates with the air return section 12 of the indoor air duct 10. Because the separator 53 isolates the first air outlet area 501 from the first air inlet area 502, air cannot flow into the first air inlet area 502 from the first air outlet area 501.

Therefore, indoor air that is drawn out of the equipment room 200 from the air inlet section 11 and that enters the first air outlet area 501 can only flow out of the composite cooling system 100 from the first side air duct 50. However, indoor air that needs to be supplemented into the equipment room 200 in the air return section 12 can be extracted only from the first air inlet area 502. In this case, the first air inlet area 502 also needs to introduce external air from the outside of the composite cooling system 100. In other words, under the action of the separator 53, the composite cooling system 100 in this application may work in a full fresh air mode.

After flowing out of the equipment room 200 through the air inlet section 11, indoor air in the equipment room 200 is completely discharged out of the composite cooling system 100 from the first air outlet area 501. Air flowing into the equipment room 200 from the air return section 12 comes from an external area communicating with the first air inlet area 502. When the composite cooling system 100 works in the full fresh air mode, an air ventilation rate in the equipment room 200 of the data center is increased, thereby maintaining indoor air quality.

It should be noted that, in the full fresh air mode, it needs to be ensured that all of indoor air in the air inlet section 11 flows into the first air outlet area 501, and all of air in the air return section 12 enters from the first air inlet area 502. In this case, the controller further needs to close the stop valves 65 at both the first-stage heat exchanger core 30 and the second-stage heat exchanger core 40, to prevent a part of indoor air from flowing into the air return section 12 from the inner cavity of the first-stage heat exchanger core 30 or the second-stage heat exchanger core 40.

In an embodiment, the separator 53 may also be disposed as a movable separator, for example, a shutter with rotatable blades. The controller of the composite cooling system 100 may open or close the gap between the first air outlet area 501 and the first air inlet area 502 by controlling rotation of the separator 53 (blades in the shutter) in the first side air duct 50, so that a part of or all of indoor air in the first air outlet area 501 enters the first air inlet area 502. Further, volume of indoor air that flows into the first air inlet area 502 from the first air outlet area 501 may be further controlled by controlling a rotation angle of the separator 53 by the controller, to control a ratio of original indoor air to fresh air for the air that flows into the air return section 12. In some other embodiments, structures such as an air valve that can adjust flow volume may be further disposed on the separator 53, and beneficial effect similar to that of the movable separator may also be achieved by adjusting and controlling the flow volume of the air valve by the controller.

Figure 10:
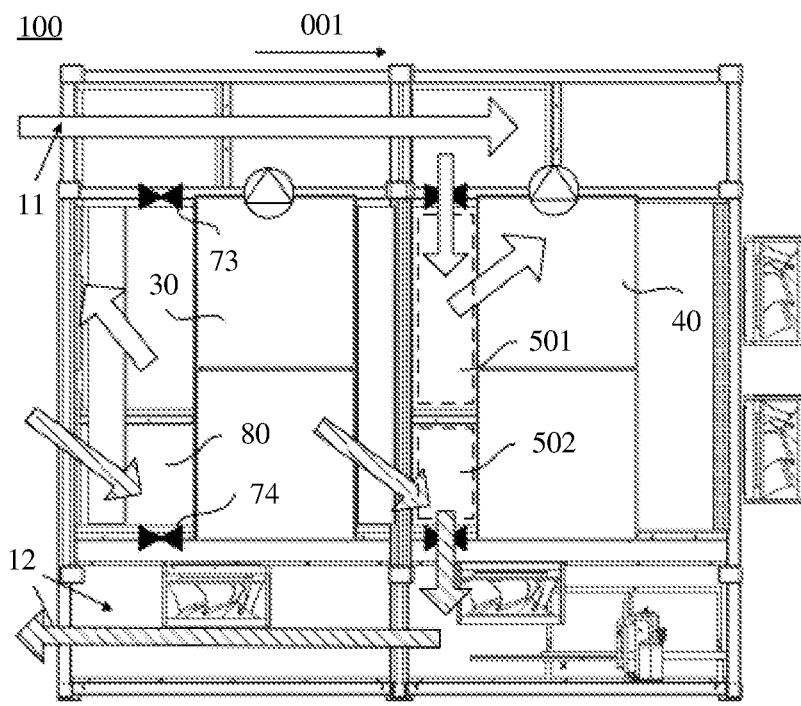
FIG. 10 is a schematic diagram of an air path of another composite cooling system in a working mode according to this application.

Refer to FIG. 10. In an embodiment, the composite cooling system 100 in this application further includes a second side air duct 80. The second side air duct 80 is located at a front end of the first-stage heat exchanger core 30, and is located between the air inlet 21 of the outdoor air duct 20 and the first-stage heat exchanger core 30. The second side air duct 80 also extends in the second direction 002, and communicates with the outside of the composite cooling system 100. The second side air duct 80 may introduce external air into the outdoor air duct 20, so that the air duct 80 works together with the air inlet 21, to expand an air inlet area of the outdoor air duct 20.

Further, the second side air duct 80 further separately communicates with the air inlet section 11 and the air return section 12, so that the second side air duct 80 is further constructed in a structure of the heat exchange section 13 of the indoor air duct 10. Specifically, the second side air duct 80 and the first side air duct 50 form a parallel structure, both of which are constructed as a part of the heat exchange section 13 of the indoor air duct 10, and can implement a circulation function of indoor air. In some embodiments, a third air valve 73 may be disposed between the second side air duct 80 and the air inlet section 11, and a fourth air valve 74 may be further disposed between the second side air duct 80 and the air return section 12. The third air valve 73 and the fourth air valve 74 are also separately connected to the controller of the composite cooling system 100. The controller may control flow volume of indoor air in the second side air duct 80 by controlling the third air valve 73 and the fourth air valve 74.

Therefore, when controlling the first air valve 71, the second air valve 72, the third air valve 73, the fourth air valve 74, the stop valve 65 disposed at the first-stage heat exchanger core 30, and the stop valve 65 disposed at the second-stage heat exchanger core 40, the controller can further control overall flow volume of indoor air in the indoor air duct 10, and allocate flow volume of indoor air flowing through the heat exchange area 110. When the composite cooling system 100 needs to work in a fresh air mode, between the first side air duct 50 and the second side air duct 80 may be controlled to work in cooperation to achieve fresh air or partial fresh air, and increase flow volume of air in the indoor air duct 10.

Figure 11:
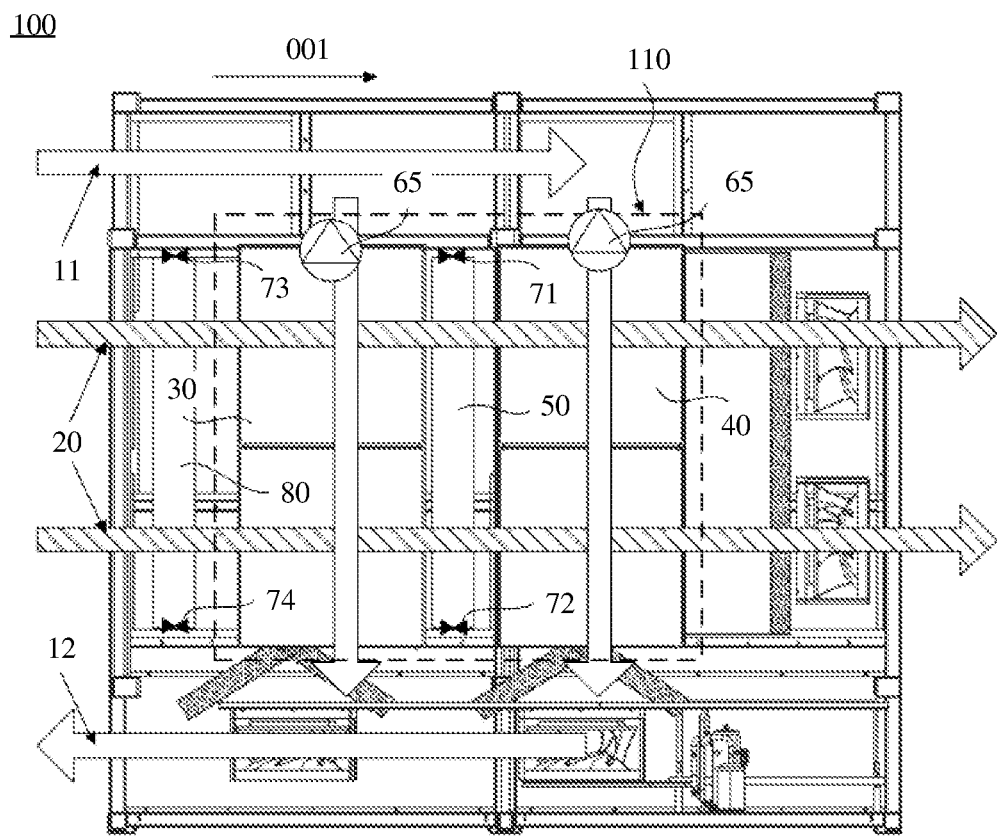
FIG. 11 is a schematic diagram of an air path of another composite cooling system in another working mode according to this application.
Figure 12:
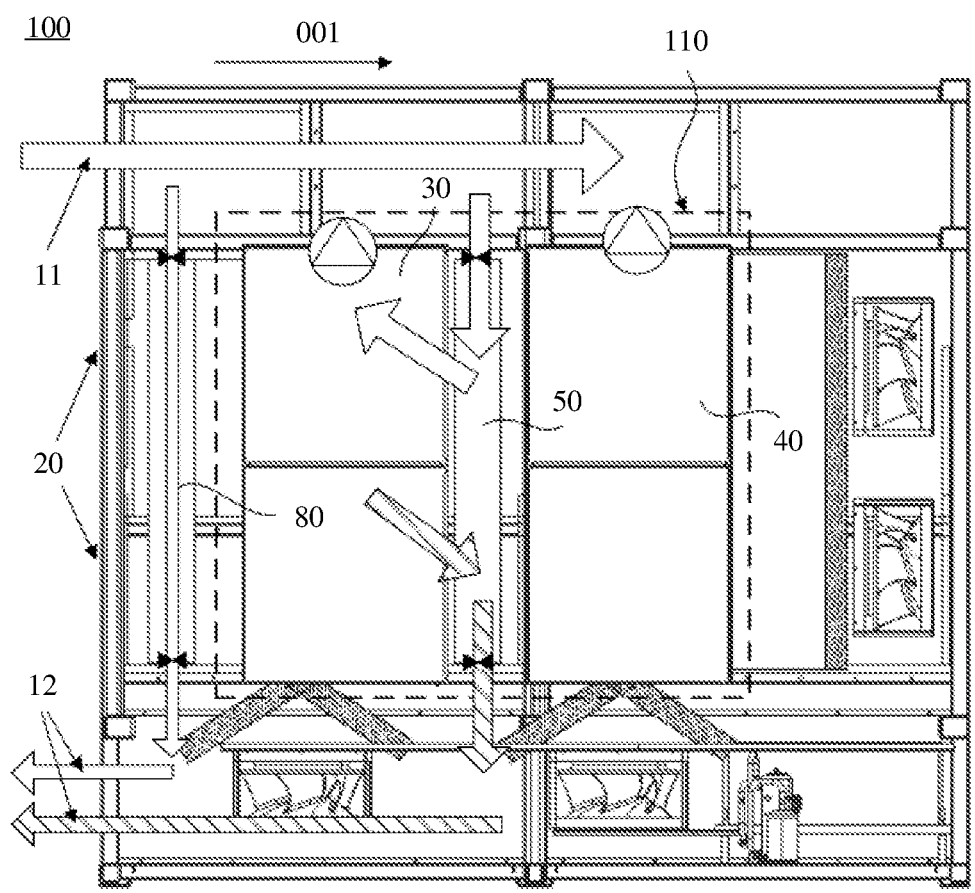
FIG. 12 is a schematic diagram of an air path of another composite cooling system in another working mode according to this application.

For example, when both the first side air duct 50 and the second side air duct 80 are in a full ventilation working mode, the composite cooling system 100 in this application is in the full fresh air working mode (as shown in FIG. 10), and ventilation volume of the full fresh air mode in this embodiment is higher than that of a structure in which only the first side air duct 50 is disposed. When both the first side air duct 50 and the second side air duct 80 are in a non-air-exchange working mode, the stop valves 65 corresponding to the first-stage heat exchanger core 30 and the second-stage heat exchanger core 40 are both opened, and the composite cooling system 100 in this application is in a circulating cooling working mode (as shown in FIG. 11). In this case, in cooperation with the outdoor air duct 20 and/or the cooling unit 64, heat dissipation and cooling may be performed on indoor air. When one of the first side air duct 50 and the second side air duct 80 is in a full air exchange working mode, and the other of the first side air duct 50 and the second side air duct 80 is in a non-air-exchange working mode, the ventilation volume of the composite cooling system 100 in this application is close to 50% (as shown in FIG. 12). With match control performed by the controller on the first air valve 71, the second air valve 72, the third air valve 73, and the fourth air valve 74, ventilation volume of the composite cooling system 100 may be further adjusted, to satisfy a use requirement of the data center equipment room 200.

It can be understood that the structure of the second side air duct 80 is similar to the structure of the first side air duct 50, and the filtering component 51, the separator 53 or a similar structure may also be disposed at the second side air duct 80. When the filtering component 51 is disposed on the second side air duct 80, air flowing into the second side air duct 80 may be cleaned and filtered. When the separator 53 is disposed on the second side air duct 80, flow volume of indoor air in the second side air duct 80 can be controlled. Further, when the separator 53 is also disposed as a movable separator, or an air valve capable of adjusting flow is disposed at the separator 53 to further adjust a ratio of indoor air to fresh air in the second side air duct 80, control precision of flow volume of air in the composite cooling system 100 in this application can be improved.

The foregoing descriptions are merely specific embodiments of this application, but are not intended to limit the protection scope of this application. Any variation or replacement, for example, reducing or adding a mechanical part, and changing a shape of a mechanical part, readily figured out by a person skilled in the art within the technical scope disclosed in this application shall fall within the protection scope of this application. When no conflict occurs, embodiments of this application and the features in the embodiments may be mutually combined. Therefore, the protection scope of this application shall be subject to the protection scope of the claims.

What is claimed is:

1. A composite cooling system, comprising:
   an indoor air duct and an outdoor air duct that are independent of each other, wherein the indoor air duct and the outdoor air duct intersect in a heat exchange area of the composite cooling system;
   a first-stage heat exchanger core, a second-stage heat exchanger core, and a first side air duct disposed in the heat exchange area, wherein the heat exchange area is a part of the outdoor air duct, and the first-stage heat exchanger core, the first side air duct, and the second-stage heat exchanger core are sequentially arranged along a flow direction of the outdoor air duct in a manner that the first side air duct is between the first-stage heat exchanger core and the second-stage heat exchanger core;
   wherein an inner cavity of the first-stage heat exchanger core and an inner cavity of the second-stage heat exchanger core each are a part of the indoor air duct;
   wherein the first side air duct communicates between the heat exchange area and the outside of the composite cooling system in a manner that external air flows into the first side air duct from the outside of the composite cooling system, and after flowing through the first-stage heat exchanger core, air in the outdoor air duct is mixed with air in the first side air duct and flows to the second-stage heat exchanger core;
   wherein a stop valve is disposed in each of the inner cavity of the first-stage heat exchanger core and the inner cavity of the second-stage heat exchanger core, and each stop valve is configured to control a flow path of the indoor air duct; and
   wherein the indoor air duct comprises a first air inlet and a first air return, and wherein in a flow direction of the indoor air duct, the first air inlet is located at a front end of the heat exchange area, the first air return is located at a rear end of the heat exchange area, the first side air duct further communicates with the first air inlet and the first air return, a first air valve is disposed between the first side air duct and the first air inlet, a second air valve is disposed between the first side air duct and the first air return, and the first side air duct is also a part of the indoor air duct.

2. The composite cooling system according to claim 1, wherein the outdoor air duct comprises a second air inlet and a second air outlet that are opposite to each other, an air blower is further disposed on the outdoor air duct, and the air blower is configured to drive air outside the second air inlet to flow into the outdoor air duct and flow out from the second air outlet.

3. The composite cooling system according to claim 2, further comprising a first humidifier located between the second air inlet and the first-stage heat exchanger core, wherein the first humidifier is configured to increase humidity of air flowing into the outdoor air duct.

4. The composite cooling system according to claim 3, further comprising a second humidifier, wherein the second humidifier is located between the first-stage heat exchanger core and the second-stage heat exchanger core, and the second humidifier configured to increase humidity of air flowing into the second-stage heat exchanger core.

5. The composite cooling system according to claim 1, further comprising evaporators located in the indoor air duct, wherein the evaporators are sequentially disposed along the flow direction of the indoor air duct at a rear end of the first-stage heat exchanger core, a rear end of the first side air duct, and a rear end of the second-stage heat exchanger core.

6. The composite cooling system according to claim 1, wherein the first side air duct further comprises a separator, the separator is disposed perpendicular to the flow direction of the indoor air duct, the separator divides the first side air duct into a third air outlet and a third air inlet, the third air outlet is connected to the first air valve, and the third air inlet is connected to the second air valve.

7. The composite cooling system according to claim 6, further comprising a second side air duct, wherein the second side air duct is located between the first air inlet and the first-stage heat exchanger core, the second side air duct communicates with the first air inlet and the first air return, a third air valve is disposed between the second side air duct and the first air inlet, a fourth air valve is disposed between the second side air duct and the first air return, and the second side air duct is also a part of the indoor air duct.

8. The composite cooling system according to claim 1, wherein the first side air duct further comprises a filter, the filter is located at an end of the first side air duct that is away from the heat exchange area, and the filter is configured to filter air that enters the heat exchange area from the first side air duct.

9. The composite cooling system according to claim 8, wherein the first side air duct further comprises a separator, the separator is disposed perpendicular to the flow direction of the indoor air duct, the separator divides the first side air duct into a third air outlet and a third air inlet, the third air outlet is connected to the first air valve, and the third air inlet is connected to the second air valve.

10. The composite cooling system according to claim 8, further comprising a second side air duct, wherein the second side air duct is located between the first air inlet and the first-stage heat exchanger core, the second side air duct communicates with the first air inlet and the first air return, a third air valve is disposed between the second side air duct and the air inlet, a fourth air valve is disposed between the second side air duct and the first air return, and the second side air duct is also a part of the indoor air duct.

11. The composite cooling system according to claim 1, further comprising a second side air duct, wherein the second side air duct is located between the first air inlet and the first-stage heat exchanger core, the second side air duct communicates with the first air inlet and the first air return, a third air valve is disposed between the second side air duct and the first air inlet, a fourth air valve is disposed between the second side air duct and the first air return, and the second side air duct is also a part of the indoor air duct.

12. A data center, comprising:
an equipment room; and
a composite cooling system, wherein the composite cooling system comprise an indoor air duct and an outdoor air duct that are independent of each other, wherein the indoor air duct and the outdoor air duct intersect in a heat exchange area of the composite cooling system;
wherein the composite cooling system further comprises a first-stage heat exchanger core, a second-stage heat exchanger core, and a first side air duct that are disposed in the heat exchange area, the heat exchange area is a part of the outdoor air duct, and the first-stage heat exchanger core, the first side air duct, and the second-stage heat exchanger core are sequentially arranged along a flow direction of the outdoor air duct in a manner that the first side air duct is between the first-stage heat exchanger core and the second-stage heat exchanger core;
wherein an inner cavity of the first-stage heat exchanger core and an inner cavity of the second-stage heat exchanger core each are a part of the indoor air duct;
wherein the first side air duct communicates between the heat exchange area and the outside of the composite cooling system in a manner that external air flows into the first side air duct from the outside of the composite cooling system, wherein after flowing through the first-stage heat exchanger core, air in the outdoor air duct is mixed with air in the first side air duct, and then flows to the second-stage heat exchanger core;
wherein two opposite ends of the indoor air duct separately communicate with an indoor area of the equipment room;
wherein a stop valve is disposed in each of the inner cavity of the first-stage heat exchanger core and the inner cavity of the second-stage heat exchanger core, and each stop valve is configured to control a flow path of the indoor air duct; and
wherein the indoor air duct comprises a first air inlet and a first air return, and wherein in a flow direction of the indoor air duct, the first air inlet is located at a front end of the heat exchange area, the first air return is located at a rear end of the heat exchange area, the first side air duct further communicates with the first air inlet and the first air return, a first air valve is disposed between the first side air duct and the first air inlet, a second air valve is disposed between the first side air duct and the first air return, and the first side air duct is also a part of the indoor air duct.

13. The data center according to claim 12, wherein the outdoor air duct comprises a second air inlet and a second air outlet that are opposite to each other, an air blower is further disposed on the outdoor air duct, and the air blower is configured to drive air outside the second air inlet to flow into the outdoor air duct and flow out from the second air outlet.

14. The data center according to claim 13, wherein the composite cooling system further comprises a first humidifier, the first humidifier is located between the second air inlet and the first-stage heat exchanger core, and the first humidifier is configured to increase humidity of air flowing into the outdoor air duct.

15. The data center according to claim 14, wherein the composite cooling system further comprises a second humidifier, wherein the second humidifier is located between the first-stage heat exchanger core and the second-stage heat exchanger core, and the second humidifier configured to increase humidity of air flowing into the second-stage heat exchanger core.

16. The data center according to claim 12, wherein the composite cooling system further comprises evaporators located in the indoor air duct, wherein the evaporators are sequentially disposed along the flow direction of the indoor air duct at a rear end of the first-stage heat exchanger core, a rear end of the first side air duct, and a rear end of the second-stage heat exchanger core.

17. The data center according to claim 12, wherein the first side air duct further comprises a separator, the separator is disposed perpendicular to the flow direction of the indoor air duct, the separator divides the first side air duct into a third air outlet and a third air inlet, the third air outlet is connected to the first air valve, and the third air inlet is connected to the second air valve.

18. The data center according to claim 17, further comprising a second side air duct, wherein the second side air duct is located between the first air inlet and the first-stage heat exchanger core, the second side air duct communicates with the first air inlet and the first air return, a third air valve is disposed between the second side air duct and the first air inlet, a fourth air valve is disposed between the second side air duct and the first air return, and the second side air duct is also a part of the indoor air duct.

19. The data center according to claim 12, wherein the first side air duct further comprises a filter, the filter is located at an end of the first side air duct that is away from the heat exchange area, and the filter is configured to filter air that enters the heat exchange area from the first side air duct.

20. The data center according to claim 19, wherein the first side air duct further comprises a separator, the separator is disposed perpendicular to the flow direction of the indoor air duct, the separator divides the first side air duct into a third air outlet and a third air inlet, the third air outlet is connected to the first air valve, and the third air inlet is connected to the second air valve.

\* \* \* \* \*